(12) United States Patent
Kato

(10) Patent No.: US 8,093,629 B2
(45) Date of Patent: Jan. 10, 2012

(54) SEMICONDUCTOR CHIP AND SEMICONDUCTOR DEVICE HAVING A PLURALITY OF SEMICONDUCTOR CHIPS

(75) Inventor: Katsuhiro Kato, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 316 days.

(21) Appl. No.: 12/193,874

(22) Filed: Aug. 19, 2008

(65) Prior Publication Data

US 2009/0078967 A1    Mar. 26, 2009

(30) Foreign Application Priority Data

Sep. 26, 2007    (JP) .................................. 2007249792

(51) Int. Cl.
*H01L 27/10* (2006.01)
*H01L 29/74* (2006.01)
*H01L 31/111* (2006.01)
*H01L 23/62* (2006.01)

(52) U.S. Cl. ......... 257/203; 257/173; 257/355; 257/360

(58) Field of Classification Search .................. 257/203, 257/666, 784, 440, 466, 448, 48, 786, 773, 257/778, 737, 173, 174, 362, 355, 111, 356, 360, 361

See application file for complete search history.

(56) References Cited

U.S. PATENT DOCUMENTS

| | | | | |
|---|---|---|---|---|
| 5,936,282 | A * | 8/1999 | Baba et al. | 257/355 |
| 6,215,157 | B1 * | 4/2001 | Fukuda | 257/362 |
| 2009/0001364 | A1 * | 1/2009 | Segawa et al. | 257/48 |

FOREIGN PATENT DOCUMENTS

| | | |
|---|---|---|
| JP | 2003-124331 | 4/2003 |
| JP | 2009-81293 | 4/2009 |

* cited by examiner

*Primary Examiner* — Chuong A. Luu
(74) *Attorney, Agent, or Firm* — Taft Stettinius & Hollister LLP

(57) ABSTRACT

The present invention comprises a semiconductor chip, and a semiconductor device having a plurality of semiconductor chips, that enables ESD protection from another semiconductor chip without increasing the chip area in case the semiconductor chip is Multi-Chip-Packaged, without wasting chip area in case the semiconductor chip is not Multi-Chip-Packaged. The exemplary semiconductor chip of the present invention includes an internal circuit and a first electrode pad electrically connected to a ground bus line of the first semiconductor chip in a region where an electrode pad, which gives and receives electric signals required for an operation of the internal circuit, cannot be provided.

17 Claims, 5 Drawing Sheets

SEMICONDUCTOR CHIP AND SEMICONDUCTOR DEVICE HAVING A PLURALITY OF SEMICONDUCTOR CHIPS

CROSS-REFERENCE TO RELATED APPLICATIONS

This application is a claims priority under 35 U.S.C. §119 to Japanese Patent Application No. 2007-249792, filed Sep. 26, 2007, and entitled, "SEMICONDUCTOR CHIP AND SEMICONDUCTOR DEVICE HAVING A PLURALITY OF SEMICONDUCTOR CHIPS," the disclosure of which is hereby incorporated by reference.

RELATED ART

1. Field of the Invention

The present invention relates to a semiconductor chip for preventing electrostatic breakdown between a plurality of semiconductor chips, and a semiconductor device having a semiconductor chip for preventing electrostatic breakdown between a plurality of semiconductor chips.

2. Brief Discussion of Related Art

A so-called Multi Chip Package ("MCP") technique for mounting a plurality of semiconductor chips in one package has recently become the most common technique utilized in the industry. Techniques have been proposed for electrically connecting a ground bus line of one semiconductor chip and a ground bus line of another semiconductor chip via a protection circuit to protect against Electrostatic Discharge ("ESD"). However, according to these techniques, an electrode pad and a protection circuit must be provided on a semiconductor chip only for protecting from ESD between a plurality of Multi-Chip-Packaged semiconductor chips. Consequently, in cases where the semiconductor chip includes an electrode pad and protection circuit, but is not used with MCP, the electrode pad and the protection circuit are unnecessary components, resulting in wasted chip area.

At the development stage of a semiconductor chip, whether or not the semiconductor chip will be used with MCP is sometimes uncertain. Similarly, a semiconductor chip is sometimes designed to be used individually and with MCP. In these cases, it is desirable that components for protecting against ESD between a plurality of MCP semiconductor chips are incorporated.

INTRODUCTION TO THE INVENTION

The invention includes a semiconductor chip and a semiconductor device having a plurality of semiconductor chips that enables ESD protection from other semiconductor chips without increasing chip area and that does not waste chip area in those cases where the semiconductor chip is not adapted for MCP.

An exemplary semiconductor chip of the present invention includes: (a) an internal circuit; and (b) a first electrode pad electrically connected to a ground bus line of the semiconductor chip in a region where an electrode pad, which gives and receives electric signals required for an operation of the internal circuit, cannot be provided.

An exemplary semiconductor device of the present invention includes a first semiconductor chip having an internal circuit and a second semiconductor chip on one mounting substrate, wherein the first semiconductor chip has a first electrode pad electrically connected to a ground bus line of the first semiconductor chip in a region where an electrode pad, which gives and receives electric signals required for an operation of the internal circuit, cannot be provided, the first electrode pad being electrically connected to a ground bus line of the second semiconductor chip.

As described above, the present invention can provide a semiconductor chip and a semiconductor device, having a plurality of semiconductor chips that enables ESD protection from other semiconductor chips without increasing the chip area for MCP, and that does not waste the chip area for those chips not subjected to MCP.

It is a first aspect of the present invention to provide a semiconductor chip, comprising: (a) an internal circuit; and (b) a first protective pad electrode pad electrically connected to a ground bus line of the semiconductor chip in a region where an active electrode pad, which gives and receives electric signals required for an operation of the internal circuit, can not be provided.

It is a first aspect of the present invention to provide a semiconductor chip, comprising: (a) an internal circuit; (b) a surface having a first side and a second side orthogonal to the first side; (c) an outermost pair of a power supply bus line and a ground bus line extending generally parallel to the first side or the second side on the surface; (d) a plurality of active electrode pads for giving and receiving electric signals necessary for the operation of the internal circuit provided along the first side and the second side in a circumference region which is between (i) an outside bus line of the outermost pair of the power supply bus line and the ground bus line, and (ii) the first and second sides; and (e) a first protective electrode pad disposed in a region of the circumference region between a closest active electrode pad to the second side among the plurality of active electrode pads disposed along the first side and a closest active electrode pad to the first side among the plurality of active electrode pads disposed along the second side.

In a more detailed embodiment of the second aspect, the first protective electrode pad is designed for electrically connecting to a ground bus line of another semiconductor chip. In yet another more detailed embodiment, the first protective electrode pad is designed for electrically connecting to a ground bus line of another semiconductor chip.

It is a third aspect of the present invention to provide a semiconductor chip, comprising: (a) a surface having a first side and a second side orthogonal to the first side; (b) an outermost pair of a power supply bus line and a ground bus line extending generally parallel to the first side or the second side on the surface; and (c) a first protective electrode pad provided in a circumference corner region on the surface, and electrically connected to the ground bus line, wherein the circumference corner region included in an overlap of both a circumference region and a corner region on the surface, the circumference region being between (a) an outside bus line of the outermost pair of the power supply bus line and the ground bus line, and (b) the first and second sides, and the corner region being outside of both a first parallel line paralleling the first side a first distance distal from the first side and a second parallel line paralleling the second side a second distance distal from the second side, the first distance being a distance between the first side and a portion of an inside bus line of the outermost pair of the power supply bus line and the ground bus line, the portion paralleling the first side, and the second distance being a distance between the second side and a portion of the inside bus line, the portion paralleling the second side.

In a more detailed embodiment of the third aspect, the semiconductor chip further includes a first electrostatic discharge protection circuit electrically connected between the first protection electrode pad and the ground bus line in the corner region. In yet another more detailed embodiment, the semiconductor chip further includes a second electrode pad electrically connected to the first electrostatic discharge protection circuit and the ground bus line in a circumference non-corner region, the circumference non-corner region being a region included by the circumference region and not included by the corner region. In a further detailed embodiment, a plurality of electrode pads including the second electrode pad are provided in the circumference non-corner region, the second electrode pad being disposed at the closest position to the first electrostatic discharge protection circuit among the plurality of electrode pads. In still a further detailed embodiment, the first protection electrode pad, the first electrostatic discharge protection circuit and the second electrode pad are continuously disposed along the first side or the second side. In a more detailed embodiment, the semiconductor chip further includes a second electrostatic discharge protection circuit electrically connected between the first protection electrode pad and the power supply bus line in the corner region.

It is a fourth aspect of the present invention to provide a semiconductor device including a first semiconductor chip having an internal circuit and a second semiconductor chip on one mounting substrate, wherein the first semiconductor chip has a first protection electrode pad electrically connected to a ground bus line of the first semiconductor chip in a region where an active electrode pad, which gives and receives electric signals required for an operation of the internal circuit, can not be provided, the first protection electrode pad being electrically connected to a ground bus line of the second semiconductor chip.

It is a fifth aspect of the present invention to provide a semiconductor device including a first semiconductor chip having a first side and a second side orthogonal to the first side on a surface and a second semiconductor chip on one mounting substrate, wherein the first semiconductor chip has an outermost pair of a power supply bus line and a ground bus line extending generally parallel to the first side or the second side on the surface, and an first protection electrode pad provided in a circumference corner region on the surface and electrically connected to the ground bus line, the circumference corner region being included in an overlap of a circumference region and a corner region on the surface, the circumference region being between (a) an outside bus line of the outermost pair of the power supply bus line and the ground bus line, and (b) the first and second sides, and the corner region being outside of both a first parallel line paralleling the first side a first distance distal from the first side and a second parallel line paralleling the second side a second distance distal from the second side, the first distance being a distance between the first side and a portion of an inside bus line of the outermost pair of the power supply bus line and the ground bus line, the portion paralleling the first side, and the second distance being a distance between the second side and a portion of the inside bus line, the portion paralleling the second side, and the first protection electrode pad being electrically connected to a ground bus line of the second semiconductor chip.

In a more detailed embodiment of the fifth aspect, the semiconductor device further includes a first electrostatic discharge protection circuit electrically connected between the first protection electrode pad and the ground bus line in the corner region. In yet another more detailed embodiment, the semiconductor device further includes a second electrode pad electrically connected to the first electrostatic discharge protection circuit and the ground bus line in a circumference non-corner region, the circumference non-corner region being a region included by the circumference region and not included by the corner region. In a further detailed embodiment, a plurality of electrode pads including the second electrode pad are provided in the circumference non-corner region, the second electrode pad being disposed at the closest position to the first electrostatic discharge protection circuit among the plurality of electrode pads. In still a further detailed embodiment, the first protection electrode pad, the first electrostatic discharge protection circuit and the second electrode pad are continuously disposed along the first side or the second side. In a more detailed embodiment, the semiconductor device further includes a second electrostatic discharge protection circuit electrically connected between the first protection electrode pad and the power supply bus line in the corner region.

It is a sixth aspect of the present invention to provide a semiconductor chip, comprising: (a) an internal circuit; and (b) a first electrode pad electrically connected to a ground bus line of the semiconductor chip in a dead region unavailable to an electrode pad, the electrode pad at least one of conveying and receiving electric signals required for an operation of the internal circuit.

In a more detailed embodiment of the sixth aspect, the first electrode pad is designed for electrically connecting to a ground bus line of another semiconductor chip.

It is a seventh aspect of the present invention to provide a semiconductor chip, comprising: (a) an internal circuit; (b) a surface having a peripheral edge at least partially defined by a first side surface and a second side surface; (c) an outermost pair of lines underneath the surface comprising an outermost bus line extending parallel to at least one of the first side and the second side; (d) a plurality of internal circuit electrode pads for at least one of conveying and receiving electric signals necessary for an operation of the internal circuit, the plurality of electrode pads extending parallel to at least one of the first side and the second side in a peripheral region of the surface, the peripheral region being at least partially delineated between those aspects of the surface overlapping the outermost bus line and the peripheral edge of the surface; and (e) a first electrode pad disposed in a dead portion of the peripheral region where none of the plurality of internal circuit electrode pads are disposed.

In a more detailed embodiment of the seventh aspect, the first electrode pad is designed for electrically connecting to a ground bus line of another semiconductor chip.

It is an eighth aspect of the present invention to provide a semiconductor chip, comprising: (a) a surface having a peripheral edge at least partially defined by a first side and a second side substantially orthogonal to the first side; (b) an outermost pair of lines comprising a power supply bus line and a ground bus line extending parallel to at least one of the first side and the second side on the surface; and (c) an first electrode pad provided in a peripheral corner region on the surface, the first electrode pad electrically connected to the ground bus line, wherein the peripheral corner region includes those portions of the surface falling within both a peripheral region and a corner region, the peripheral region being at least partially delineated between the peripheral edge of the surface and those aspects of the surface overlapping the outermost pair of lines, and the corner region being at least partially delineated by the peripheral edge of the surface and by a first imaginary line paralleling the first side a first distance from the peripheral edge adjacent the first side and by a second imaginary line paralleling the second side a second distance from the peripheral edge adjacent the second side.

In a more detailed embodiment of the eighth aspect, the first distance is a distance between the first side and an inside bus line of the outermost pair of lines that parallels the first side, and the second distance is a distance between the second side and an inside bus line of the outermost pair of lines that parallels the second side. In yet another more detailed embodiment, the semiconductor chip further includes a first electrostatic discharge protection circuit electrically interposing the first electrode pad and the ground bus line in the corner region. In a further detailed embodiment, the semiconductor chip further includes a second electrode pad electrically connected to the first electrostatic discharge protection circuit and the ground bus line in a peripheral non-corner region, the peripheral non-corner region being a region within the peripheral region, but outside of the corner region. In still a further detailed embodiment, a plurality of electrode pads, including the second electrode pad, are provided in the peripheral non-corner region. In a more detailed embodiment, the second electrode pad is adjacent the first electrostatic discharge protection circuit. In a more detailed embodiment, the first electrode pad, the first electrostatic discharge protection circuit and the second electrode pad are sequentially disposed along the first side and the second side. In another more detailed embodiment, the semiconductor chip further includes a second electrostatic discharge protection circuit electrically interposing the first electrode pad and the power supply bus line in the corner region.

It is a ninth aspect of the present invention to provide a semiconductor device including a first semiconductor chip having an internal circuit and a second semiconductor chip on one mounting substrate, wherein the first semiconductor chip has a first electrode pad electrically connected to a ground bus line of the first semiconductor chip in a dead region, the first electrode pad being electrically connected to a ground bus line of the second semiconductor chip, and where the dead region comprises a region where an electrode pad at least one of conveying and receiving electric signals required for an operation of the internal circuit cannot be disposed.

It is a tenth aspect of the present invention to provide a semiconductor chip, comprising: (a) an internal circuit; and (b) a first electrostatic discharge protection circuit at least partially disposed within a dead region, the dead region comprising a peripheral region proximate an edge of the semiconductor chip, the dead region being unavailable for occupation by any electrode pad for conveying or receiving electric signals required for an operation of the internal circuit.

It is an eleventh aspect of the present invention to provide a semiconductor device including a first semiconductor chip having a first side and a second side orthogonal to the first side and a second semiconductor chip on one mounting substrate, wherein the first semiconductor chip has an outermost pair of lines comprising a power supply bus line and a ground bus line extending parallel to both the first side and the second side, and a first electrode pad provided in a peripheral corner region on a surface of the first semiconductor chip and electrically connected to a ground bus line, the peripheral corner region comprising a peripheral region and a corner region on the surface, the peripheral region delineated at least partially by outermost line of the outermost pair of lines, an edge of the first side, and an edge of the second side, and the corner region delineated at least partially by the edge of the first side, the edge of the second side, a first imaginary line paralleling the edge of the first side a first distance from the first side, and a second imaginary line paralleling the edge of the second side a second distance from the second side, the first distance is a distance between the first side and a portion of an inside bus line of the outermost pair of lines that parallels the first side, and the second distance is a distance between the second side and a portion of an inside bus line that parallels the second side, and the first electrode pad is electrically connected to a ground bus line of the second semiconductor chip.

In a more detailed embodiment of the eleventh aspect, the semiconductor device further includes a first electrostatic discharge protection circuit electrically interposing the first electrode pad and the ground bus line in the corner region. In yet another more detailed embodiment, the semiconductor device further includes a second electrode pad electrically connected to the first electrostatic discharge protection circuit and the ground bus line in a peripheral non-corner region, the peripheral non-corner region being a region included by the peripheral region, but outside of the corner region. In a further detailed embodiment, a plurality of electrode pads including the second electrode pad are provided in the peripheral non-corner region. In still a further detailed embodiment, the second electrode pad is adjacent the first electrostatic discharge protection circuit. In a more detailed embodiment, the first electrode pad, the first electrostatic discharge protection circuit, and the second electrode pad are sequentially disposed along the first side and the second side. In a more detailed embodiment, the semiconductor device further includes a second electrostatic discharge protection circuit electrically interposing the first electrode pad and the power supply bus line in the corner region.

DETAILED DESCRIPTION

The exemplary embodiments of the present invention are described and illustrated below to encompass semiconductor chips for preventing electrostatic breakdown between a plurality of semiconductor chips, methods of manufacturing the same, and devices incorporating the same. Of course, it will be apparent to those of ordinary skill in the art that the embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

Exemplary embodiments of the present invention will be explained below with reference to the drawings. It is noted that the drawings merely show the shape, size and positional relationship of each component schematically to a degree of giving understanding of the invention and the invention is not specifically defined by them. Although specific materials, conditions and numerical conditions may be used in the explanation below, they are only one example and the invention is not limited by them at all.

A semiconductor device in the exemplary embodiments of the present invention "Multi-Chip-Packages" a plurality of semiconductor chips. Further, the semiconductor device provides a protective electrode pad electrically connected to a ground bus line of the semiconductor chip in a circumference corner region of the semiconductor chip. Electrode pads were not provided in the circumference corner region conventionally.

Hereinafter, the exemplary embodiments of the present invention will be explained in detail with reference to the drawings.

The first exemplary embodiment provides a protection electrode pad in a circumference corner region of a semiconductor chip and also provides an ESD protection circuit in a corner region of the semiconductor chip. This ESD protection circuit is electrically connected between the protection electrode pad and a ground bus line of the semiconductor chip.

A semiconductor device in the first exemplary embodiment of the present invention will be explained with reference to FIG. 1 to FIG. 5.

Figure 1:
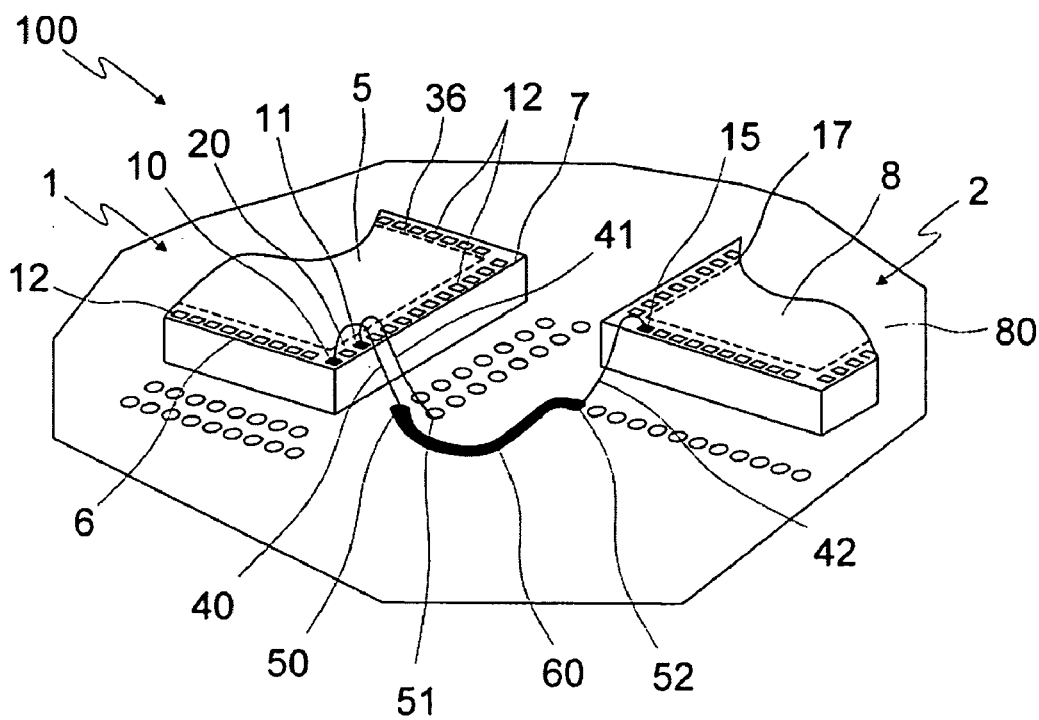
FIG. 1 is a perspective view showing an exemplary semiconductor device in accordance with a first exemplary embodiment.
Figure 2:
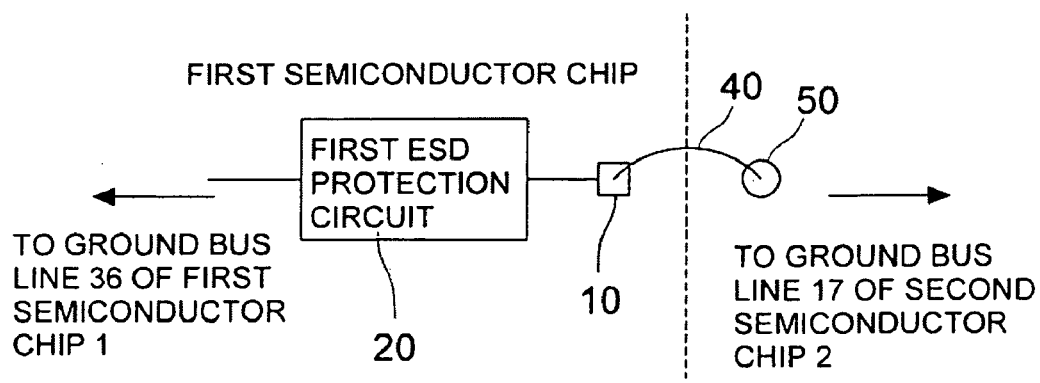
FIG. 2 is a diagram showing an electric connection of a portion of the semiconductor device in the first exemplary embodiment.
Figure 3:
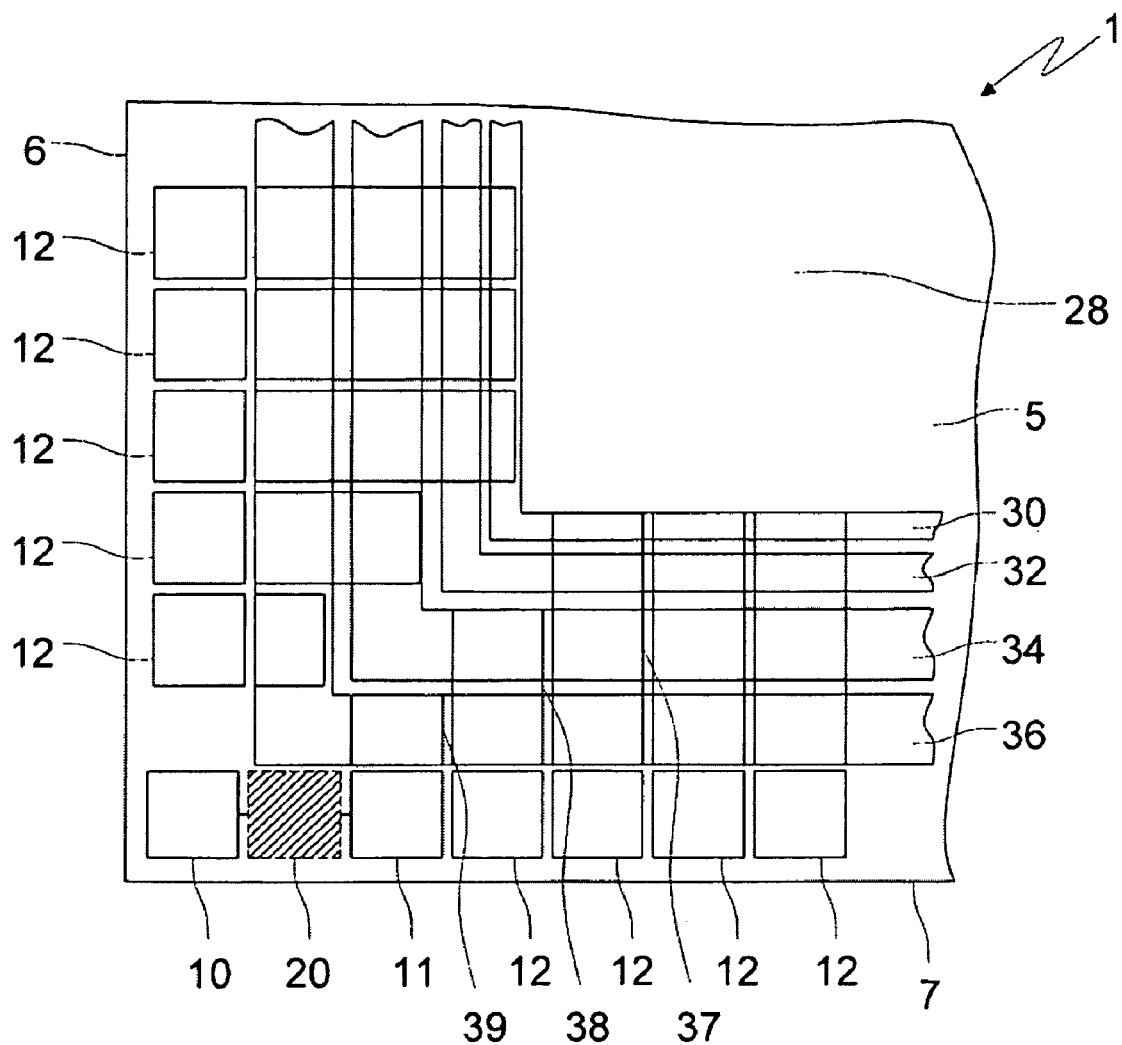
FIG. 3 is a plan view showing a portion of the semiconductor device in accordance with the first exemplary embodiment.
Figure 4A:
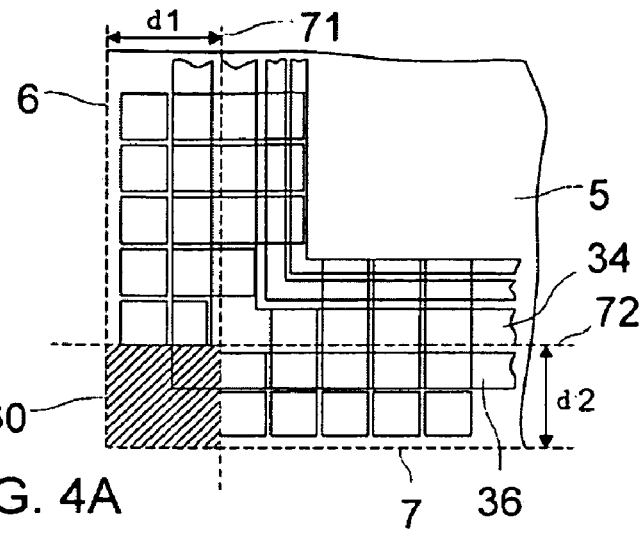
FIG. 4A-4C are plan views showing portions of the semiconductor device in accordance with the first exemplary embodiment.
Figure 4B:
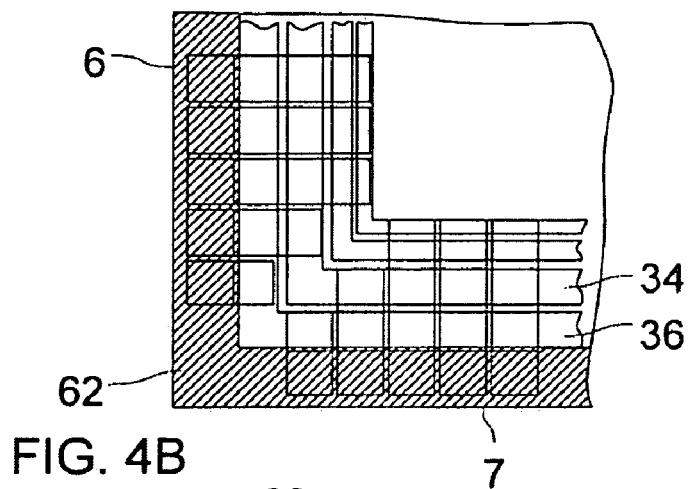
Figure 4C:
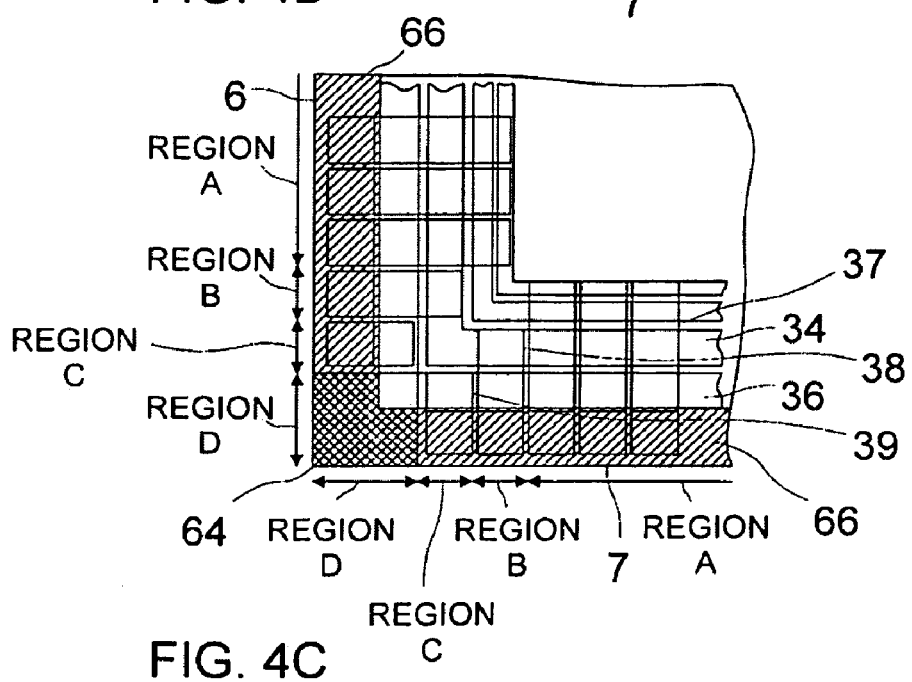
Figure 5:
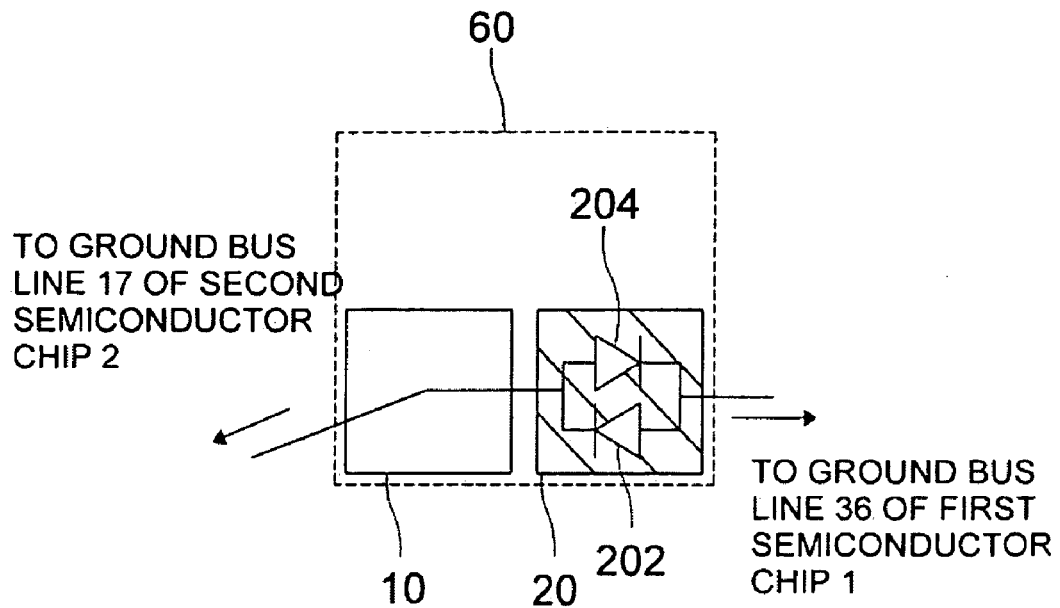
FIG. 5 is an exemplary ESD protection circuit for use with the semiconductor device in the first exemplary embodiment.

FIG. 1 is a perspective view showing a schematic constitution of the semiconductor device in the first exemplary embodiment. FIG. 2 is a diagram showing an electric connection of a feature portion of the semiconductor device in the first exemplary embodiment. FIG. 3 is a plan view showing a constitution of a feature portion of the semiconductor device in the first exemplary embodiment. FIG. 4A to FIG. 4C are plan views explaining a surface area of the semiconductor device in the first exemplary embodiment. FIG. 5 is a concrete constitutional example of an ESD protection circuit applicable to the semiconductor device in the first exemplary embodiment A schematic constitution of the semiconductor device in the first exemplary embodiment will be explained with reference to FIG. 1.

A semiconductor device 100 is a semiconductor device having a first semiconductor chip 1 and a second semiconductor chip 2 on one mounting substrate 80. The semiconductor device 100 is so-called "Multi Chip Package" (MCP). Incidentally, this constitution is sometimes described as "the first semiconductor chip 1 and the second semiconductor chip 2 are Multi-Chip-Packaged" in this detailed description.

A surface 5 opposite to the mounting substrate 80 in the first semiconductor chip 1 has a first side 6 and a second side 7 in a circumference. A first electrode pad 10, a second electrode pad 11, and other electrode pads 12 are formed on the surface 5 along the circumference including the first side 6 and the second side 7. The first electrode pad 10 is electrically connected to a ground bus line (an input/output ground bus line 36) of the first semiconductor chip 1 via an electrostatic discharge (ESD) protection circuit 20 adjacent to the first electrode pad 10 and a second electrode pad 11. The second electrode pad 11 is connected to an electrode 51 on the mounting substrate 80 via a ground voltage supplying wire 41. The electrode 51 supplies a ground (VSS) voltage to the second electrode pad 11.

Meanwhile, the first electrode pad 10 is also electrically connected to a ground bus line 17 of the second semiconductor chip 2 via a ground voltage supplying wire 42 which supplies a ground voltage to the second semiconductor chip 2. More specifically, the first electrode pad 10 is electrically connected to an electrode 50 on the mounting substrate 80 via a bonding wire 40. The electrode 50 is connected to an electrode 52 via a printed wiring 60 on the mounting substrate 80. The electrode 52 is connected to an electrode pad 15 of the second semiconductor chip 2 via the ground voltage supplying wire 42. The electrode pad 15 is one of electrode pads formed along with a circumference of a surface 8 of the second semiconductor chip 2, the surface 8 being opposite to the mounting substrate 80. The electrode pad 15 is electrically connected to the ground bus line 17 of the second semiconductor chip 2.

An electric connection of a feature portion of the semiconductor device in the first exemplary embodiment will be explained with reference to FIG. 2.

The first electrode pad 10 of the semiconductor device in the first exemplary embodiment is electrically connected between the ground bus line 36 of the first semiconductor chip 1 and the ground bus line 17 of the second semiconductor chip 2.

Concretely, one end of the first electrode pad 10 provided on the first semiconductor chip 1 is electrically connected to the ground bus line 36 via the ESD protection circuit 20. The other end of the first electrode pad 10 is electrically connected to the ground bus line 17 of the second semiconductor chip 2 via the first electrode pad 10, the bonding wire 40, the electrode 50 and the ground electrode supplying wire 42 of the semiconductor chip 2.

As described above, electrically connecting the ground bus line 36 of the first semiconductor chip 1 and the ground bus line 17 of the second semiconductor chip 2 can prevent an element breakdown resulting from an electrostatic discharge between the first semiconductor chip 1 and the second semiconductor chip 2. Further, providing the ESD protection circuit 20 between the ground bus line 36 of the first semiconductor chip 1 and the ground bus line 17 of the second semiconductor chip 2 can minimally suppress an influence from one semiconductor chip to the other semiconductor chip in case noise breaks out in one semiconductor chip.

A constitution of a feature portion of the semiconductor device in the first exemplary embodiment will be explained with reference to FIG. 3 and FIG. 4A to FIG. 4C.

FIG. 3 is a plan view magnifying a vicinity of the first electrode pad 10 of the first semiconductor chip 1.

The surface 5 of the first semiconductor chip 1 has the first side 6 and the second side 7 orthogonal to the first side 6 in the circumference.

Pairs of a power supply bus line and a ground bus line extend parallel to the first side 6 or the second side 7, surrounding an internal circuit 28, in the first semiconductor chip 1. Concretely, a pair of bus lines including an internal power supply bus line 30 and an internal ground bus line 32 is provided outside the internal circuit 28. A pair of bus lines including an input/output power supply bus line 34 and the input/output ground bus line 36 is provided outside the internal ground bus line 32. Accordingly, two pairs of a power supply bus line and a ground bus line are provided in the first semiconductor chip 1, and the input/output power supply bus line 34 and the input/output ground bus line 36 of them are the outermost pair of a power supply bus line and a ground bus line. Incidentally, "a power supply bus line" is also referred to as "VDD bus line", and "a ground bus line" is also referred to as "VSS bus line" or "GND bus line". The internal circuit 28 collectively means electronic circuits provided approximately at the center of the surface 5. Further, the internal circuit 28 can be other than electronic circuits which are included in cells provided at a peripheral region of the surface 5. Namely, the cells are a power supply line cell, a ground line cell or an I/O (input/output) cell 37, a power supply line cell or a ground line cell 38, and a ground line cell 39.

The electrode pad 10 and the first electrostatic discharge (ESD) protection circuit 20 are provided at a region in the vicinity of a corner where the first side 6 and the second side 7 bisect at right angles. A second electrode pad 11 and a plurality of electrode pads 12 are provided along circumferences, and at a region other than the vicinity of the corner.

A region where the first electrode pad 10, the first ESD protection circuit 20, the second electrode pad 11 and the plurality of electrode pads 12 are disposed will be explained in detail with reference to FIG. 4A to FIG. 4C.

Firstly, FIG. 4A shows a corner region 60.

The corner region 60 is a region on the surface 5. The corner region 60 is surrounded by a first parallel line 71 and a second parallel line 72. The first parallel line 71 parallels the first side 6 a first distance d1 distant from the first side 6. The second parallel line 72 parallels the second side 7 a second distance d2 distant from the second side 7.

The first distance d1 is a distance between the first side 6 and a portion of an inside bus line of the outermost pair of a power supply bus line and a ground bus line, the portion paralleling the first side 6. Namely, the outermost pair of a power supply bus line and a ground bus line in the first exemplary embodiment is the input/output power supply bus line 34 and the input/output ground bus line 36. The bus line located inside of them is the input/output power supply bus line 34. Therefore, the first distance d1 is a distance between the first side 6 and a portion of the input/output power supply bus line 34 which parallels the first side 6.

The second distance d2 is a distance between the second side 7 and a portion of an inside bus line of the outermost pair of a power supply bus line and a ground bus line, the portion paralleling the second side 7. Namely, the outermost pair of a power supply bus line and a ground bus line in the first preferred embodiment is a pair of the input/output power supply bus line 34 and the input/output ground bus line 36. The bus line located inside of them is the input/output power supply bus line 34. Therefore, the second distance d2 is a distance between the second side 7 and a portion of the input/output power supply bus line 34 which parallels the second side 7.

The corner region 60 is a vacant region where circuit elements are not usually provided. In other words, the corner region 60 is usually a so-called dead space.

Next, FIG. 4B shows a circumference region 62.

The circumference region 62 is a region on the surface 5. The circumference region 62 is a peripheral region outside of the outside bus line of the outermost pair of a power supply bus line and a ground bus line, and inside of the first side 6 and the second side 7. Namely, the outermost pair of a power supply bus line and a ground bus line in the first exemplary embodiment is a pair of the input/output power supply bus line 34 and the input/output ground bus line 36. The bus line located outside of them is the input/output ground bus line 36. Therefore, the peripheral region on the surface 5 outside of the input/output ground bus line 36, and inside of the first side 6, and the second side 7 is the circumference region 62.

Next, FIG. 4C shows a circumference corner region 64 and a circumference non-corner region 66.

The circumference corner region 64 is a region that includes an overlap of both the circumference region 62 and the corner region 60.

The circumference non-corner region 66 is a region included by the circumference region 62 and not included by the corner region 60. In other words, the circumference non-corner region 66 is one part of the circumference region 62 but is not included by the corner region 60.

The circumference non-corner region 66 is where active electrode pads, used for giving and receiving electric signals necessary for the operation of the internal circuit 28, can be provided. On the other hand, the circumference corner region 64 is where active electrode pads, used for giving and receiving electric signals necessary for the operation of the internal circuit 28, can not be provided. Accordingly, the circumference corner region 64 is a so-called dead space.

Here, the reason the circumference corner region 64 is a dead space will be explained in detail.

Firstly, in a region A, a power supply line cell, a ground line cell or an I/O cell 37 which can connect to all the bus lines 30, 32, 34 and 36 can be disposed (see FIG. 4C). Accordingly, active electrode pads which can electrically connect to all the bus lines 30, 32, 34 and 36 can be disposed in the region A of the circumference non-corner region 66.

Next, in a region B, a power supply line cell or a ground line cell 38 which can connect to the bus lines 34 and 36 can be disposed (see FIG. 4C). Accordingly, active electrode pads which can electrically connect to the bus lines 34 and 36 can be disposed in the region B of the circumference non-corner region 66.

Next, in a region C, a ground line cell 39 which can connect only to the bus line 36 can be disposed (see FIG. 4C). Accordingly, active electrode pads which can electrically connect only to the bus line 36 can be disposed in the region C of the circumference non-corner region 66.

However, in a region D, a power supply line cell, a ground line cell or an I/O cell which can connect to any one of the bus lines 30, 32, 34 and 36 can not be disposed (see FIG. 4C). Accordingly, active electrode pads, used for giving and receiving electric signals necessary for the operation of the internal circuit 28, can not be disposed in the region D of the circumference non-corner region 66.

The regions defined in this way are the corner region 60, the circumference region 62, the circumference corner region 64, and the circumference non-corner region 66.

Going back to FIG. 3, positions where the first electrode pad 10, the first ESD protection circuit 20, the second electrode pad 11, and the plurality of electrode pads 12 are disposed will be explained.

The first electrode pad 10 is disposed in the circumference corner region 64 indicated in FIG. 4C. The circumference corner region 64 was conventionally where electrode pads were not disposed. However, it is an advantageous aspect of the present invention to dispose the first electrode pad 10 in such a region. Therefore, the chip area does not increase even if the first electrode pad 10 is added. Further, the reason the first electrode pad 10 can be disposed in the circumference corner region 64 is that the first electrode pad 10 is not an active electrode pad used for giving and receiving electric signals necessary for the operation of the internal circuit 28, but a protection electrode pad used for electrically connecting a ground bus line (I/O ground bus line 36) of the first semiconductor chip 1 and the ground bus line 17 of the second semiconductor chip 2.

In the first exemplary embodiment, the first electrode pad 10 is disposed nearest to the corner in the circumference corner region 64. Further, the first electrode pad 10 is disposed in the same straight line as the plurality of electrode pads 12 disposed along the first side 6, and also in the same straight line as the plurality of electrode pads 12 disposed along the second side 7.

The first ESD protection circuit 20 is disposed in the corner region 60. In this exemplary embodiment, the first ESD protection circuit 20 can be disposed anywhere in the corner region 60 whereas the first electrode pad 10 is disposed in the circumference corner region 64. This is because the circuit elements including diodes or transistors comprising the first ESD protection circuit 20 are formed on a surface of a semiconductor substrate, whereas electrode pads are formed on the same layer as a metal layer. One end of the first ESD protection circuit 20 is electrically connected to the first electrode pad 10. The other end of the first ESD protection circuit 20 is electrically connected to the second electrode pad 11.

The first ESD protection circuit 20 is disposed between the first electrode pad 10 and the second electrode pad 11, and is also disposed adjacent to both the first electrode pad 10 and the second electrode pad 11. According to this disposition, ESD protection between a plurality of semiconductor chips can be realized via shortest path. Further, the first ESD protection circuit 20 is disposed in the same straight line as the plurality of electrode pads 12 disposed along the second side 7.

The second electrode pad 11 and the plurality of electrode pads 12 are disposed in the circumference non-corner region 66. Each of the second electrode pad 11 and the plurality of electrode pads 12 is used for giving and receiving electric signals necessary for the operation of the internal circuit 28. The second electrode pad 11 is electrically connected to both the input/output ground bus line 36 and the ground voltage supplying wire 41. The second electrode pad 11 is a so-called GND (VSS) pad for supplying ground voltage to the input/output ground bus line 36. Further the second electrode pad 11 is also electrically connected to the first electrode pad 10 via the first ESD protection circuit 20.

The second electrode pad 11 is disposed at the closest position to the first ESD protection circuit 20 among the second electrode pad 11 and the plurality of electrode pads 12 in the first preferred embodiment. This disposition can realize ESD protection between a plurality of semiconductor chips via the shortest path. The second electrode pad 11 and the plurality of electrode pad 12 are linearly disposed along the first side 6 or the second side 7.

As stated above, the dispositions of the first electrode pad 10, the first ESD protection circuit 20, the second electrode pad 11 and the plurality of electrode pads 12 were respectively explained. Further, the disposition of the first electrode pad 10 can also be comprehended as stated-below.

The first electrode pad 10 is disposed in a region of the circumference region 62 between the closest electrode pad to the second side 7 among a plurality of electrode pads (i.e. the plurality of electrode pads 12) disposed along the first side 6 and the closest electrode pad to the first side 6 among a plurality of electrode pads (i.e. the second electrode pad 11 and the plurality of electrode pads 12) disposed along the second side 7.

Further, the first electrode pad 10, the first ESD protection circuit 20 and the second electrode pad 11 are continuously disposed along the second side 7. Such disposition is advantageous in view of ESD protection between a plurality of semiconductor chips and chip area efficiency. Incidentally, disposing the first electrode pad 10, the first ESD protection circuit 20 and the second electrode pad 11 continuously along the first side 6 can obtain the same effect.

Next, a concrete constitutional example of an ESD protection circuit applicable to the semiconductor device in the first exemplary embodiment will be explained with reference to FIG. 5.

As the ESD protection circuit 20, bidirectional diodes in which a PN junction diode 202 and a PN junction diode 204 are connected in the opposite direction in parallel are utilized. More specifically, the anode of the PN junction diode 202 is electrically connected to a ground bus line (the input/output ground bus line 36) of the first semiconductor chip 1 via the second electrode pad 1, and the cathode of the PN junction diode 202 is electrically connected to the ground bus line 17 of the second semiconductor chip 2 via the first electrode pad 10. The anode of the PN junction diode 204 is electrically connected to the ground bus line 17 of the second semiconductor chip 2 via the first electrode pad 10, and the cathode of the PN junction diode 204 is electrically connected to a ground bus line (the input/output ground bus line 36) of the first semiconductor chip 1 via the second electrode pad 11.

Bidirectional transistors in which two n-type MOS transistors are connected in parallel can be used in place of the PN junction diodes 202, 204. In this instance, an n-type MOS transistor in which the source and the gate is electrically connected to the ground bus line (the input/output ground bus line 36) of the first semiconductor chip 1 via the second electrode pad 11 and the drain is electrically connected to the ground bus line 17 of the second semiconductor chip 2 via the first electrode pad 10 and another n-type MOS transistor in which the source and the gate is electrically connected to the ground bus line 17 of the second semiconductor chip 2 via the first electrode pad 10 and the drain is electrically connected to the ground bus line (the input/output ground bus line 36) of the first semiconductor chip 1 via the second electrode pad 11 are connected in parallel.

Next, operation of the semiconductor device 100 in the exemplary preferred embodiment will be explained.

In case an electrostatic surge is applied between one of a plurality of electrode pads of the first semiconductor chip 1 and one of a plurality of electrode pads of the second semiconductor chip 2, namely an electrostatic discharge occurred, the electrostatic surge current will reach to the other semiconductor chip via the first electrode pad 10 and will dissipate.

Further, even if a voltage of a ground bus line in one of the first semiconductor chip 1 and the second semiconductor chip 2 unintentionally varied due to a noise generated in the semiconductor chip, the interposition of the first ESD protection circuit 20 can suppress bad effect to the other semiconductor chip to the minimum.

The semiconductor device in the first exemplary embodiment as explained above can lead to the following effects.

Firstly, because the first electrode pad electrically connected to the ground bus line (the input/output ground bus line 36) of the first semiconductor chip 1 is disposed in the circumference corner region 64, ESD protection between Multi-Chip-Packaged semiconductor chips can be realized without increasing the chip area. Namely, a new region doesn't need to be kept because the circumference corner region 64 is where electrode pads, used for giving and receiving electric signals necessary for the operation of the internal circuit 28, can not be provided. Further, providing the first electrode pad 10 which is electrically connected to the ground bus line 36 of the first semiconductor chip 1 enables the ground bus line 36 to connect to a ground bus line of another semiconductor chip which is Multi-Chip-Packaged as necessary, resulting in realizing ESD protection between a plurality of semiconductor chips. Incidentally, because the circumference corner region 64 is not used intrinsically, the first semiconductor chip 1 doesn't waste the chip area even when the semiconductor chip 1 is not Multi-Chip-Packaged.

Secondly, providing the first ESD protection circuit 20 which is electrically connected between the first electrode pad 10 and the second electrode pad 11 in the corner region 60 can minimally suppress an influence from one semiconductor chip to the other semiconductor chip in case noise breaks out in one semiconductor chip, while realizing ESD protection between Multi-Chip-Packaged semiconductor chips without increasing the chip area. Namely, a new region for disposing an ESD protection circuit doesn't need to be kept because the corner region 60 is a vacant region where circuit elements are not usually provided. Further, providing an ESD protection circuit between ground bus lines of a plurality of semiconductor chips instead of directly connecting ground bus lines of a plurality of semiconductor chips with each other can minimally suppress an influence from one semiconductor chip to the other semiconductor chip even if a voltage of a ground bus line of one semiconductor chip unintentionally varies due to a noise.

Next, the second exemplary embodiment will be explained.

The second exemplary embodiment adds a second ESD protection circuit in a corner region of a semiconductor chip. The second ESD protection circuit is electrically connected between an electrode pad and a power supply bus line of the semiconductor chip.

A semiconductor device in the second exemplary embodiment of the present invention will be explained with reference to FIG. 6 to FIG. 8.

Figure 6:
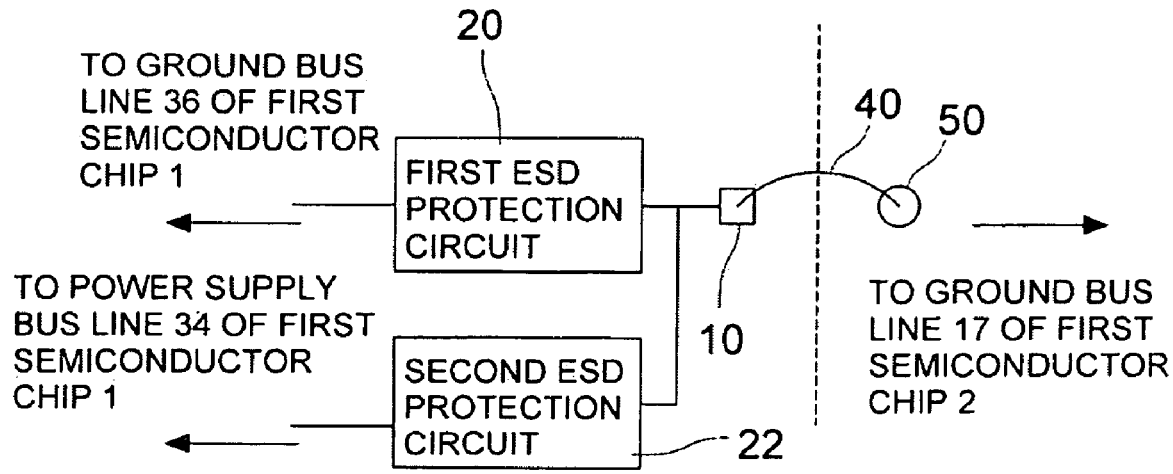
FIG. 6 is a diagram showing an electric connection of a portion of a semiconductor device in accordance with a second exemplary embodiment.

FIG. 6 is a diagram showing an electric connection of a feature portion of the semiconductor device in the second exemplary embodiment. FIG. 7 is a plan view showing a constitution of a feature portion of the semiconductor device in the second exemplary embodiment. FIG. 8 is a concrete constitutional example of an ESD protection circuit applicable to the semiconductor device in the second exemplary embodiment.

A schematic constitution of the semiconductor device in the second exemplary embodiment is the same as the schematic constitution of the semiconductor device in the first exemplary embodiment shown in FIG. 1. Explanations of the same elements as ones of the first exemplary embodiment are omitted by granting the same symbols.

An electric connection of a feature portion of the semiconductor device in the second exemplary embodiment will be explained with reference to FIG. 6.

The second exemplary embodiment adds an ESD protection circuit 22 to the first semiconductor chip 1.

One end of the second ESD protection circuit 22 is electrically connected to the input/output power supply bus line 34 of the first semiconductor chip 1, and the other end of the second ESD protection circuit 22 is electrically connected to the ground bus line 17 of the second semiconductor chip 2 via the first electrode pad 10, the bonding wire 40, the electrode 50, and the ground voltage supplying wire 42. More specifically, the power supply bus line electrically connected to one end of the second ESD protection circuit 22 needs to be a counterpart of the ground bus line (the input/output ground bus line 36) to which ground voltage is supplied. Connecting the second ESD protection circuit 22 to such a power supply bus line results in providing both the first ESD protection circuit 20 and the second ESD protection circuit 22 between a pair of power bus lines (i.e. the input/output power supply bus line 34 and the input/output ground bus line 36). Here, "a pair of power bus lines" means a pair of a power supply bus line and a ground bus line.

As described above, adding the second ESD protection circuit 22 to the first semiconductor chip 1 in addition to the first ESD protection circuit 20 more reliably prevents an element breakdown due to an electrostatic discharge between the first semiconductor chip 1 and the second semiconductor chip 2.

Next, a constitution of a feature portion of the semiconductor device in the second exemplary embodiment will be explained with reference to FIG. 7 and FIG. 4A to FIG. 4C.

Figure 7:
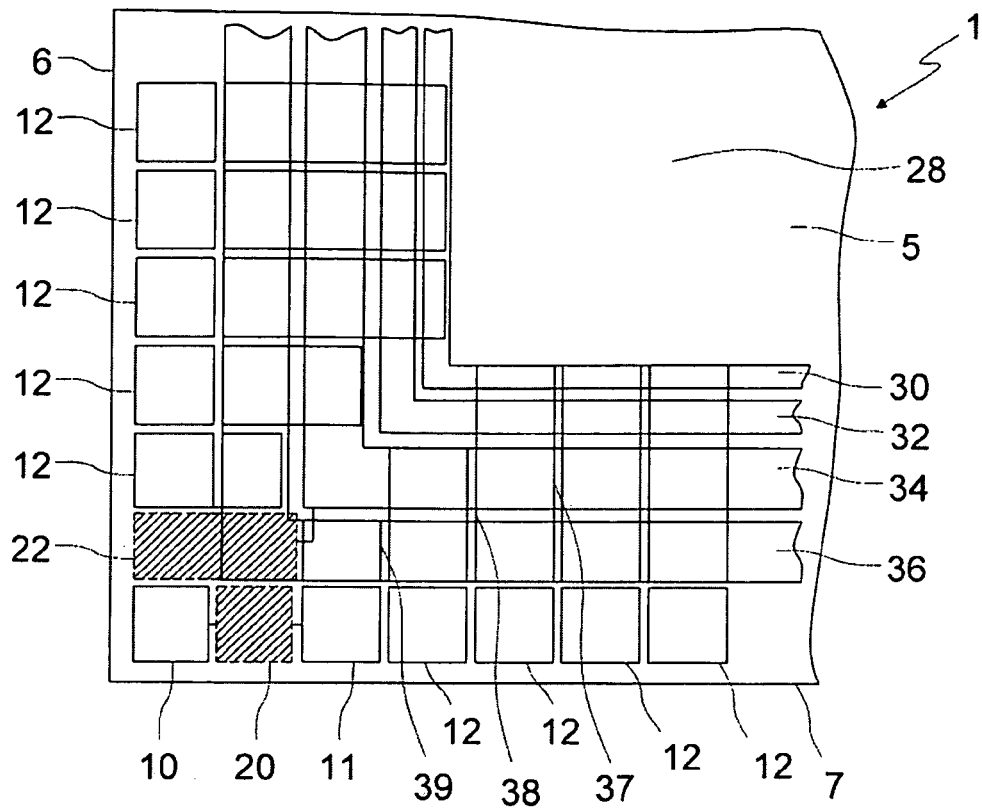
FIG. 7 is a plan view showing a portion of the semiconductor device in accordance with the second exemplary embodiment.
Figure 8:
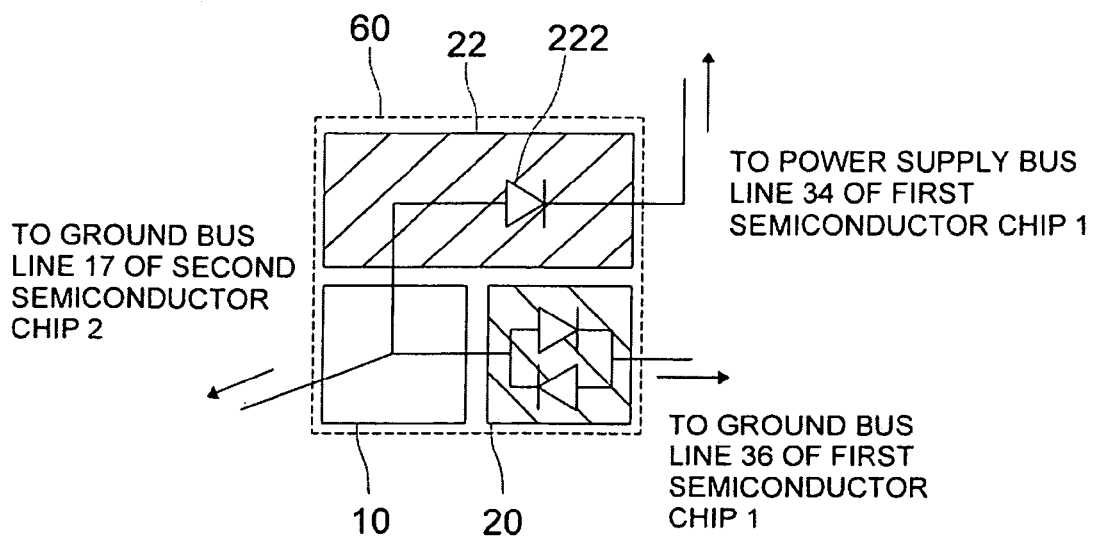
FIG. 8 is an exemplary ESD protection circuit for use with the semiconductor device of the second exemplary embodiment.

FIG. 7 is a plan view magnifying a vicinity of the first electrode pad 10 of the first semiconductor chip 1.

The feature of the semiconductor device in the second exemplary embodiment is that the second ESD protection circuit 22 is provided in the corner region 60 shown in FIG. 4A.

The second ESD protection circuit 22 can be disposed anywhere in the corner region 60, while the first electrode pad 10 is disposed in the circumference corner region 64. This is because the circuit elements including diodes or transistors comprising the second ESD protection circuit 22 are formed on a surface of a semiconductor substrate, while electrode pads are formed on the same layer as a metal layer. One end of the second ESD protection circuit 22 is electrically connected to the first electrode pad 10. The other end of the second ESD protection circuit 22 is electrically connected to the input/output power supply bus line 34.

The second ESD protection circuit 22 is disposed adjacent to the first electrode pad 10 in the second exemplary embodiment. According to this disposition, ESD protection between a plurality of semiconductor chips can be realized via shortest path. Further, the second ESD protection circuit 22 is disposed in the same straight line as the plurality of electrode pads 12 disposed along the first side 6. Incidentally, the second ESD protection circuit 22 may be formed within the circumference corner region 64, while the second ESD protection circuit 22 is formed also in the corner region 60 other than the circumference corner region 64 in the second exemplary embodiment.

Next, a concrete constitutional example of the second ESD protection circuit 22 applicable to the semiconductor device in the second exemplary embodiment will be explained with reference to FIG. 8.

As the ESD protection circuit 22, a PN junction diode 222 is utilized. More specifically, the anode of the PN junction diode 222 electrically connected to the ground bus line 17 of the second semiconductor chip 2 via the first electrode pad 10, and the cathode of the PN junction diode 222 is electrically connected to the input/output power supply bus line 34.

Also an n-type MOS transistor can be used in place of the PN junction diode 222. More specifically, the source and the gate is electrically connected to the ground bus line 17 of the second semiconductor chip 2 via the first electrode pad 10, and the drain is electrically connected to the input/output power supply bus line 34.

Next, operation of the semiconductor device 200 in the second exemplary embodiment will be explained.

In case an electrostatic surge is applied between one of a plurality of electrode pads of the first semiconductor chip 1 and one of a plurality of electrode pads of the second semiconductor chip 2, namely an electrostatic discharge occurred, the electrostatic surge current will reach to the other semiconductor chip via two paths and will dissipate. Namely, one of the paths goes through the first ESD protection circuit 20 and the first electrode pad 10, and the other of the paths goes through the second ESD protection circuit 22 and the first electrode pad 10.

The semiconductor device in the second exemplary embodiment as explained above can lead to the following effects in addition to the same effects obtained from the semiconductor device according to the first exemplary embodiment.

Firstly, providing the second ESD protection circuit 22 which is electrically connected between the first electrode pad 10 and the input/output power supply bus line 34 in the corner region 60 can realize more reliable ESD protection between Multi-Chip-Packaged semiconductor chips without increasing the chip area. Namely, a new region for disposing an ESD protection circuit doesn't need to be kept because the corner region 60 is a vacant region where circuit elements are not usually provided. Further, in case an electrostatic surge is applied between one of a plurality of electrode pads of the first semiconductor chip 1 and one of a plurality of electrode pads of the second semiconductor chip 2, the electrostatic surge current will reach to the other semiconductor chip via two paths and will dissipate. Namely, one of the paths goes through the first ESD protection circuit 20 and the first electrode pad 10, and the other of the paths goes through the second ESD protection circuit 22 and the first electrode pad 10. Therefore, more reliable ESD protection can be realized.

Secondly, providing both the first ESD protection circuit 20 and the second ESD protection circuit 22 between a pair of power bus lines (i.e. the input/output power supply bus line 34 and the input/output ground bus line 36) enables the first ESD protection circuit 20 and the second ESD protection circuit 22 to function as a protection circuit between the input/output power supply bus line 34 and the input/output ground bus line 36 in the first semiconductor chip 1. Namely, in both cases that the semiconductor chip 1 is not Multi-Chip-Packaged and solely used, and that the semiconductor chip 1 is Multi-Chip-Packaged and used with other semiconductor chips, the first ESD protection circuit 20 and the second ESD protection circuit can operate. Therefore, a wasteful situation can be avoided, the situation being that although an ESD protection circuit is provided to a semiconductor chip, the ESD protection circuit can not fulfill its function because the semiconductor chip is not Multi-Chip-Packaged eventually.

As described above, exemplary embodiments of the present inventions are explained. However, the scope of the present invention is not limited to the embodiments, and a wide variety of transformations can be achieved based on the principle of the present invention.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A semiconductor chip, comprising:
an internal circuit; and
a first protective electrode pad electrically connected to a ground bus line of the semiconductor chip in a region where an active electrode pad, which gives and receives electric signals required for an operation of the internal circuit, can not be provided.

2. A semiconductor chip, comprising:
an internal circuit;
a surface having a first side and a second side orthogonal to the first side;
an outermost pair of a power supply bus line and a ground bus line extending generally parallel to the first side or the second side on the surface;
a plurality of active electrode pads for giving and receiving electric signals necessary for the operation of the internal circuit provided along the first side and the second side in a circumference region which is between (a) an outside bus line of the outermost pair of the power supply bus line and the ground bus line, and (b) the first and second sides; and
a first protective electrode pad disposed in a region of the circumference region between a closest active electrode pad to the second side among the plurality of active electrode pads disposed along the first side and a closest active electrode pad to the first side among the plurality of active electrode pads disposed along the second side.

3. The semiconductor chip according to claim 1, wherein the first protective electrode pad is designed for electrically connecting to a ground bus line of another semiconductor chip.

4. The semiconductor chip according to claim 2, wherein the first protective electrode pad is designed for electrically connecting to a ground bus line of another semiconductor chip.

5. A semiconductor chip, comprising:
a surface having a first side and a second side orthogonal to the first side;
an outermost pair of a power supply bus line and a ground bus line extending generally parallel to the first side or the second side on the surface; and
an first protective electrode pad provided in a circumference corner region on. the surface, and electrically connected to the ground bus line,
wherein the circumference corner region included in an overlap of both a circumference region and a corner region on the surface,
the circumference region being between (a) an outside bus line of the outermost pair of the power supply bus line and the ground bus line, and (b) the first and second sides, and
the corner region being outside of both a first parallel line paralleling the first side a first distance distal from the first side and a second parallel line paralleling the second side a second distance distal from the second side,
the first distance being a distance between the first side and a portion of an inside bus line of the outermost pair of the power supply bus line and the ground bus line, the portion paralleling the first side, and
the second distance being a distance between the second side and a portion of the inside bus line, the portion paralleling the second side.

6. The semiconductor chip according to claim 5, further comprising a first electrostatic discharge protection circuit electrically connected between the first protection electrode pad and the ground bus line in the corner region.

7. The semiconductor chip according to claim 6, further comprising a second electrode pad electrically connected to the first electrostatic discharge protection circuit and the ground bus line in a circumference non-corner region, the circumference non-corner region being a region included by the circumference region and not included by the corner region.

8. The semiconductor chip according to claim 7, wherein a plurality of electrode pads including the second electrode pad are provided in the circumference non-corner region, the second electrode pad being disposed at the closest position to the first electrostatic discharge protection circuit among the plurality of electrode pads.

9. The semiconductor chip according to claim 8, wherein the first protection electrode pad, the first electrostatic discharge protection circuit and the second electrode pad are continuously disposed along the first side or the second side.

10. The semiconductor chip according to claim 6, further comprising a second electrostatic discharge protection circuit electrically connected between the first protection electrode pad and the power supply bus line in the corner region.

11. A semiconductor device including a first semiconductor chip having an internal circuit and a second semiconductor chip on one mounting substrate, wherein
the first semiconductor chip has a first protection electrode pad electrically connected to a ground bus line of the first semiconductor chip in a region where an active electrode pad, which gives and receives electric signals required for an operation of the internal circuit, can not be provided, the first protection electrode pad being electrically connected to a ground bus line of the second semiconductor chip.

12. A semiconductor device including a first semiconductor chip having a first side and a second side orthogonal to the first side on a surface and a second semiconductor chip on one mounting substrate, wherein
the first semiconductor chip has an outermost pair of a power supply bus line and a ground bus line extending generally parallel to the first side or the second side on the surface, and an first protection electrode pad provided in a circumference corner region on the surface and electrically connected to the ground bus line,
the circumference corner region being included in an overlap of a circumference region and a corner region on the surface,
the circumference region being between (a) an outside bus line of the outermost pair of the power supply bus line and the ground bus line, and (b) the first and second sides, and
the corner region being outside of both a first parallel line paralleling the first side a first distance distal from the first side and a second parallel line paralleling the second side a second distance distal from the second side,
the first distance being a distance between the first side and a portion of an inside bus line of the outermost pair of the power supply bus line and the ground bus line, the portion paralleling the first side, and
the second distance being a distance between the second side and a portion of the inside bus line, the portion paralleling the second side, and
the first protection electrode pad being electrically connected to a ground bus line of the second semiconductor chip.

13. The semiconductor device according to claim 12, further comprising a first electrostatic discharge protection circuit electrically connected between the first protection electrode pad and the ground bus line in the corner region.

14. The semiconductor device according to claim 13, further comprising a second electrode pad electrically connected to the first electrostatic discharge protection circuit and the ground bus line in a circumference non-corner region, the circumference non-corner region being a region included by the circumference region and not included by the corner region.

15. The semiconductor device according to claim 14, wherein a plurality of electrode pads including the second electrode pad are provided in the circumference non-corner region, the second electrode pad being disposed at the closest position to the first electrostatic discharge protection circuit among the plurality of electrode pads.

16. The semiconductor device according to claim 15, wherein the first protection electrode pad, the first electrostatic discharge protection circuit and the second electrode pad are continuously disposed along the first side or the second side.

17. The semiconductor device according to claim 16, further comprising a second electrostatic discharge protection circuit electrically connected between the first protection electrode pad and the power supply bus line in the corner region.

* * * * *